US008848367B2

(12) United States Patent
Adducci et al.

(10) Patent No.: US 8,848,367 B2
(45) Date of Patent: Sep. 30, 2014

(54) THERMAL MANAGEMENT SYSTEM

(75) Inventors: Samuel J. Adducci, Palos Heights, IL (US); Andrzej Nicewicz, Glenview, IL (US)

(73) Assignee: Panduit Corp., Tinley Park, IL (US)

( * ) Notice: Subject to any disclaimer, the term of this patent is extended or adjusted under 35 U.S.C. 154(b) by 218 days.

(21) Appl. No.: 13/617,876

(22) Filed: Sep. 14, 2012

(65) Prior Publication Data

US 2013/0070416 A1 Mar. 21, 2013

Related U.S. Application Data

(60) Provisional application No. 61/535,163, filed on Sep. 15, 2011.

(51) Int. Cl.
*H05K 7/20* (2006.01)
(52) U.S. Cl.
CPC .................................. *H05K 7/20572* (2013.01)
USPC ............................ 361/694; 361/695; 454/184
(58) Field of Classification Search
None
See application file for complete search history.

(56) References Cited

U.S. PATENT DOCUMENTS

| 7,764,495 | B2 * | 7/2010 | Hruby et al. ................... 361/692 |
| 7,957,139 | B2 * | 6/2011 | Davis et al. ................... 361/690 |
| 2008/0266789 | A1 * | 10/2008 | Hruby et al. ................... 361/692 |
| 2009/0122484 | A1 * | 5/2009 | Caveney ........................ 361/692 |
| 2010/0172092 | A1 * | 7/2010 | Davis et al. ................... 361/692 |
| 2010/0238626 | A1 | 9/2010 | Linhares, Jr. et al. |
| 2011/0045759 | A1 * | 2/2011 | Rasmussen et al. .......... 454/184 |
| 2011/0096498 | A1 * | 4/2011 | Tambe .......................... 361/695 |

* cited by examiner

*Primary Examiner* — Gregory Thompson
(74) *Attorney, Agent, or Firm* — Christopher S. Clancy; James H. Williams

(57) ABSTRACT

A thermal management system for an electronic equipment enclosure is provided. The thermal management system includes an intake duct for routing cold air in the front of the electronic equipment enclosure to the side of electronic equipment enclosure and one or more blanking panels for separating cold air in the front of the electronic equipment enclosure and hot air in the back of the electronic enclosure, as needed, for example, depending on the configuration of the thermal management system and/or the electronic equipment enclosure. The intake duct includes a front cover, which acts as an additional blanking panel, when installed, changing the airflow pattern of the electronic equipment enclosure, for example, from side-to-side to front-to back.

20 Claims, 6 Drawing Sheets

THERMAL MANAGEMENT SYSTEM

CROSS REFERENCE TO RELATED APPLICATIONS

This application claims priority to U.S. Provisional Patent Application No. 61/535,163, filed on Sep. 15, 2011, which is incorporated by reference in its entirety.

BACKGROUND OF THE INVENTION

The present invention relates to a thermal management system for an electronic equipment enclosure. More particularly, the present invention relates to a thermal management system for an electronic equipment enclosure that is capable of accommodating more than one type of airflow pattern for cooling.

For example, some electronic equipment, such as Cisco's Nexus 7010 Switch, requires a front-to-back airflow pattern for cooling, while other electronic equipment, such as Cisco's Nexus 7018 Switch, requires a side-to-side airflow pattern for cooling. However, existing electronic equipment enclosures, such as Panduit's NET-ACCESS™ Switch Cabinet Family, are typically configured to accommodate only one type of airflow pattern for cooling.

Therefore, there is a need for a thermal management system for an electronic equipment enclosure that is capable of accommodating more than one type of airflow pattern for cooling.

SUMMARY OF THE INVENTION

A thermal management system for an electronic equipment enclosure is provided. The thermal management system includes an intake duct for routing cold air in the front of the electronic equipment enclosure to the side of electronic equipment enclosure and one or more blanking panels for separating cold air in the front of the electronic equipment enclosure and hot air in the back of the electronic enclosure, as needed, for example, depending on the configuration of the thermal management system and/or the electronic equipment enclosure. The intake duct includes a front cover, which acts as an additional blanking panel, when installed, changing the airflow pattern of the electronic equipment enclosure, for example, from side-to-side to front-to back.

DETAILED DESCRIPTION

Figure 1:
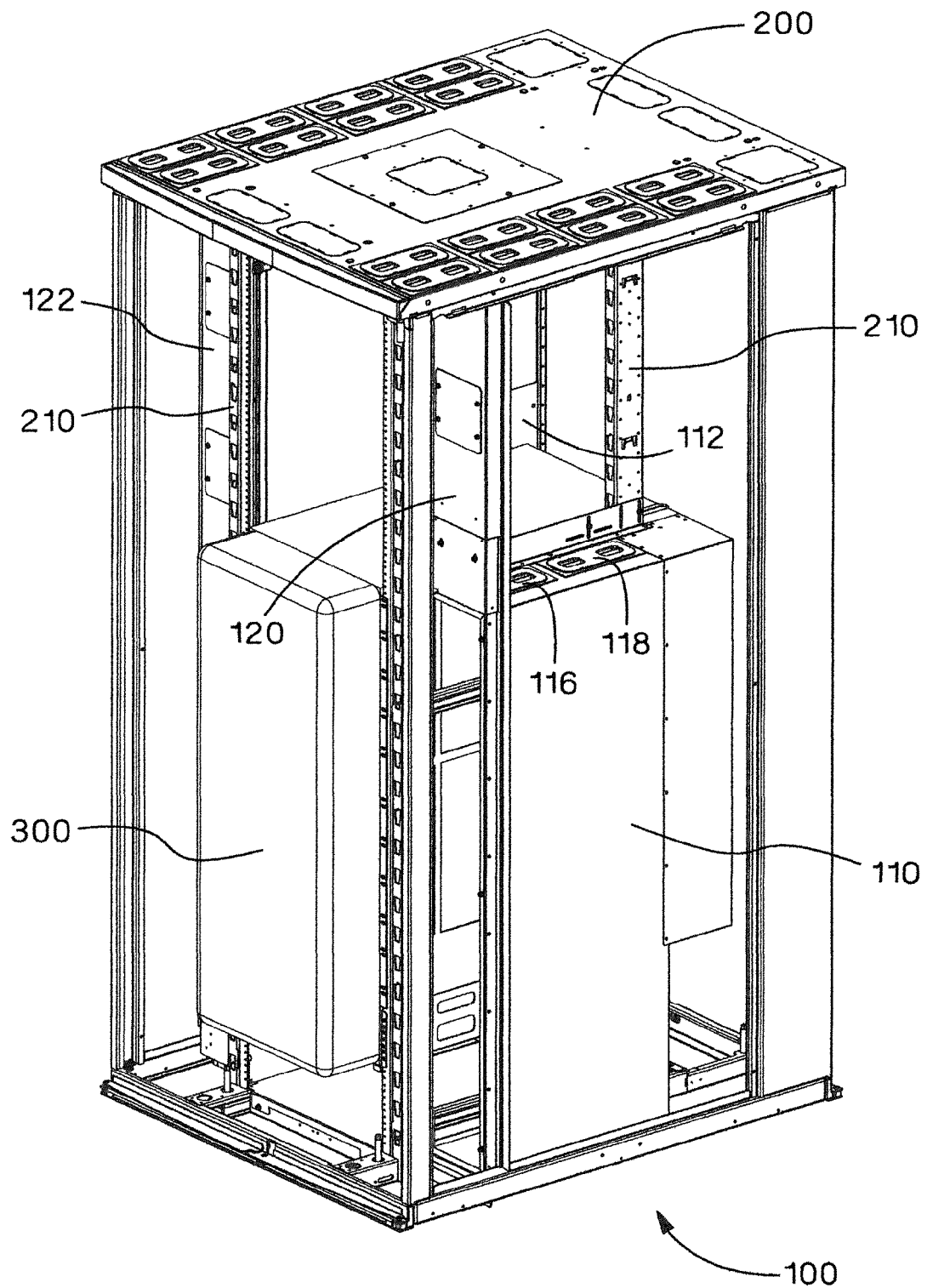
FIG. 1 is a front perspective view of a thermal management system for an electronic equipment enclosure according to an embodiment of the present invention, showing the thermal management system configured for electronic equipment requiring a side-to-side airflow pattern for cooling.

FIGS. 1-6 illustrate a thermal management system 100 for an electronic equipment enclosure 200, such as Panduit's NET-ACCESS™ Switch Cabinet Family, according to an embodiment of the present invention.

The thermal management system 100 includes an intake duct 110 for routing cold air from the front of the electronic equipment enclosure 200 to the side of the electronic equipment enclosure 200. The intake duct 110 includes a front cover 112, a back cover 114, and one or more top covers, such as first top cover 116 and second top cover 118. Additionally, the thermal management system 100 includes one or more blanking panels, such as first blanking panel 120, second blanking panel 122, and third blanking panel 124, for separating cold air in the front of the electronic equipment enclosure 200 and hot air in the back of the electronic equipment enclosure 200, as needed, for example, depending on the configuration of the thermal management system 100 and/or the electronic equipment enclosure 200.

The electronic equipment enclosure 200 includes four vertical posts 210 and four electronic equipment rails 220.

Figure 2:
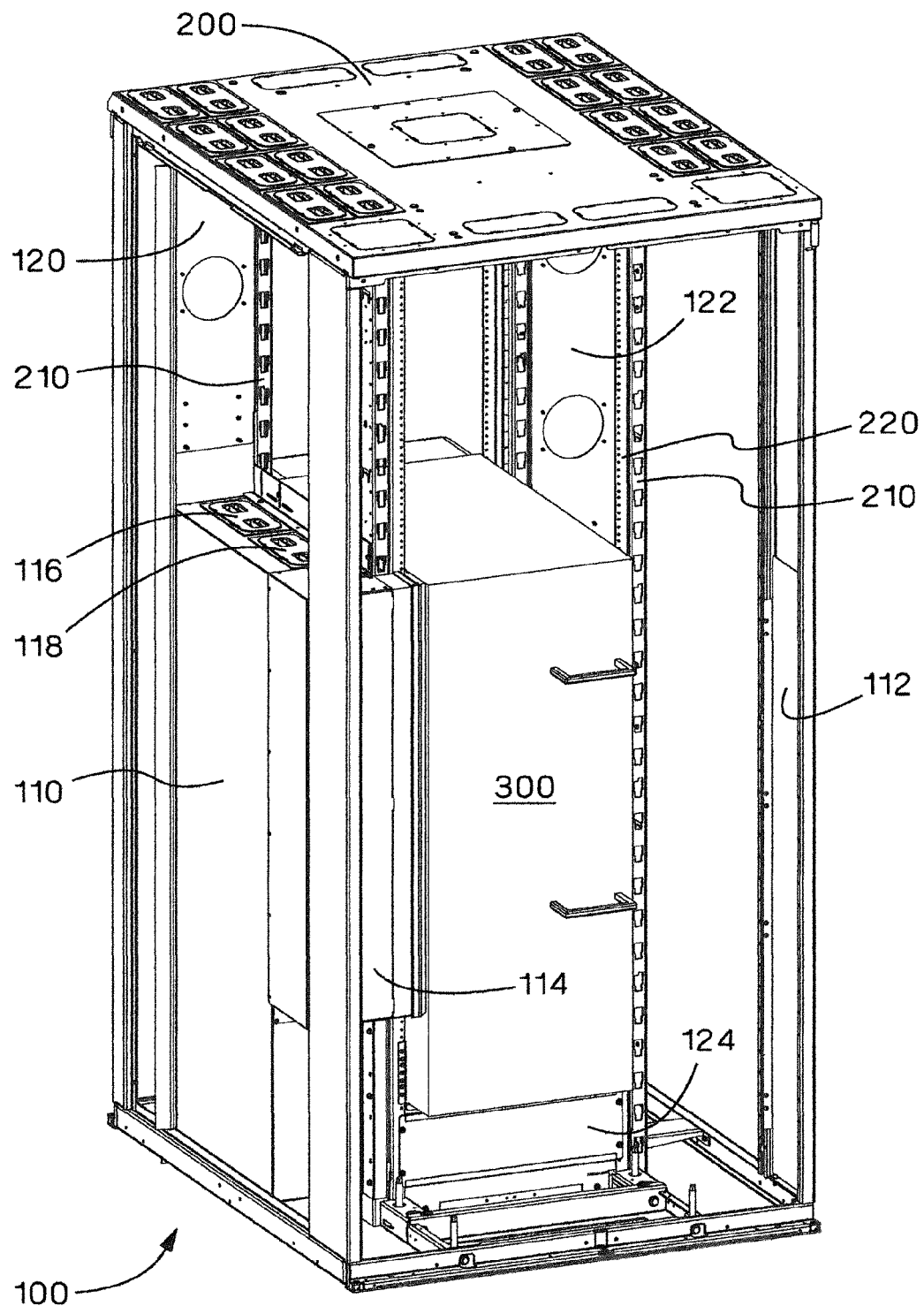
FIG. 2 is a back perspective view of the thermal management system of FIG. 1.
Figure 3:
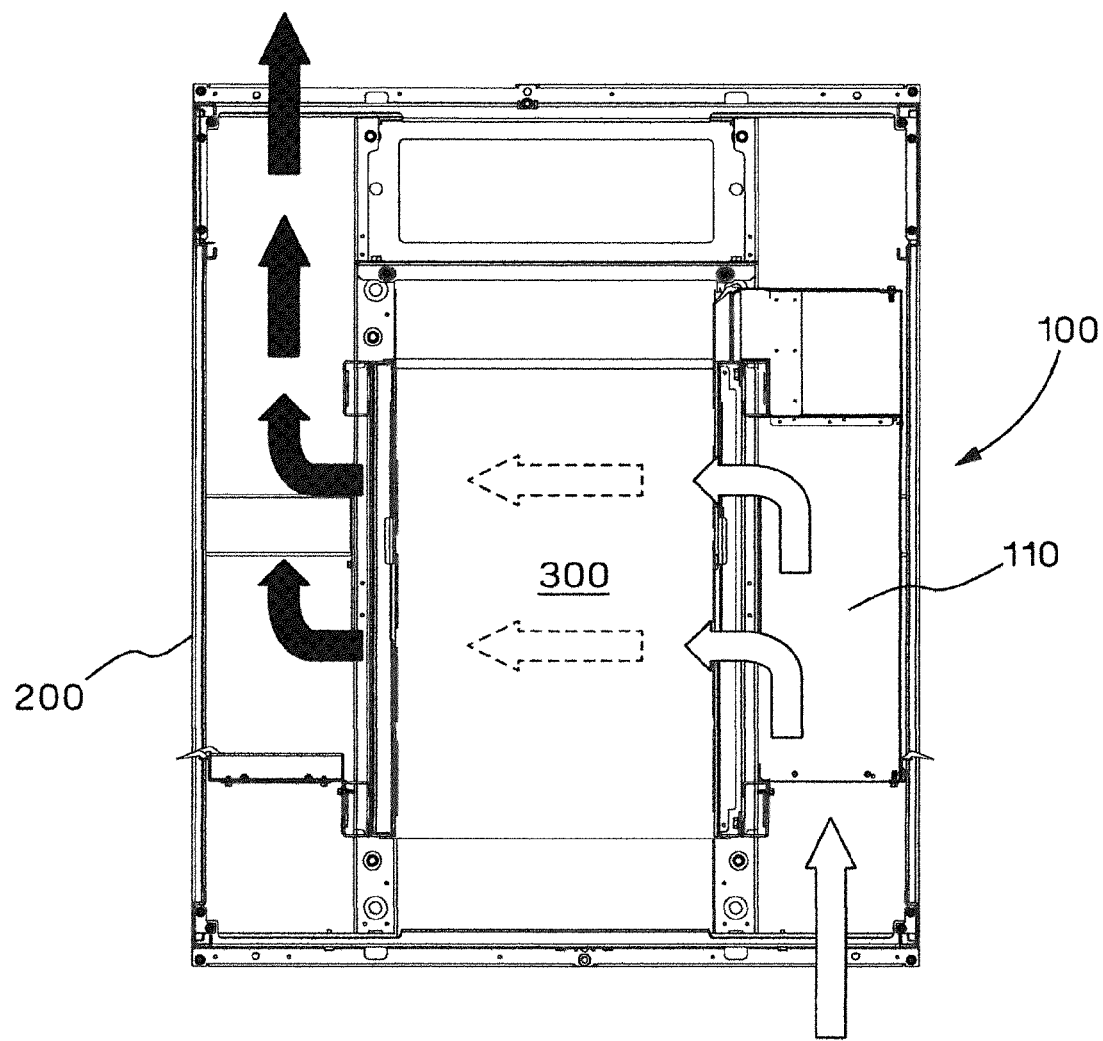
FIG. 3 is a top view of the thermal management system of FIG. 1, showing the side-to-side airflow pattern.

As shown in FIGS. 1-3, the thermal management system 100 is configured for electronic equipment 300 requiring a side-to-side airflow pattern for cooling (FIG. 3), such as Cisco's Nexus 7018 Switch. The intake duct 110 is located on the intake side of the electronic equipment 300, preferably between the electronic equipment 300 and the adjacent side panel of the electronic equipment enclosure 200. Preferably, the intake duct 110 is mounted to the vertical posts 210, but alternative mounting locations are likewise contemplated. The front cover 112 of the intake duct 110 has been removed, routing cold air from the front of the electronic equipment enclosure 200 to the side intake of the electronic equipment 300, as shown in FIG. 3. Preferably, the front cover 112 is stored along the back side of the electronic equipment enclosure 200, as shown in FIG. 2.

Additionally, as shown in FIGS. 1-3, the first or partial height vertical blanking panel 120 is located on the intake side of the electronic equipment 300, preferably between the electronic equipment 300 and the adjacent side panel of the electronic equipment enclosure 200, and extends from the top of the electronic equipment enclosure 200 to the top of the intake duct 110. The second or full height vertical blanking panel 122 is located on the exhaust side of the electronic equipment 300, preferably between the electronic equipment 300 and the adjacent side panel of the electronic equipment enclosure 200, and extends from the top of the electronic equipment enclosure 200 to the bottom of the electronic equipment enclosure 200. The third or horizontal blanking panel 124 is located below the electronic equipment 300 and extends between the electronic equipment rails 220 in the back of the electronic equipment enclosure 200. Preferably, each of the blanking panels 120, 122, 124 is mounted to the corresponding vertical posts 210 or electronic equipment rails 220, but alternative mounting locations are likewise contemplated. Preferably, each of the blanking panels 120, 122, 124 includes seals to seal any gaps along the top, bottom, and sides of the blanking panels 120, 122, 124.

Figure 4:
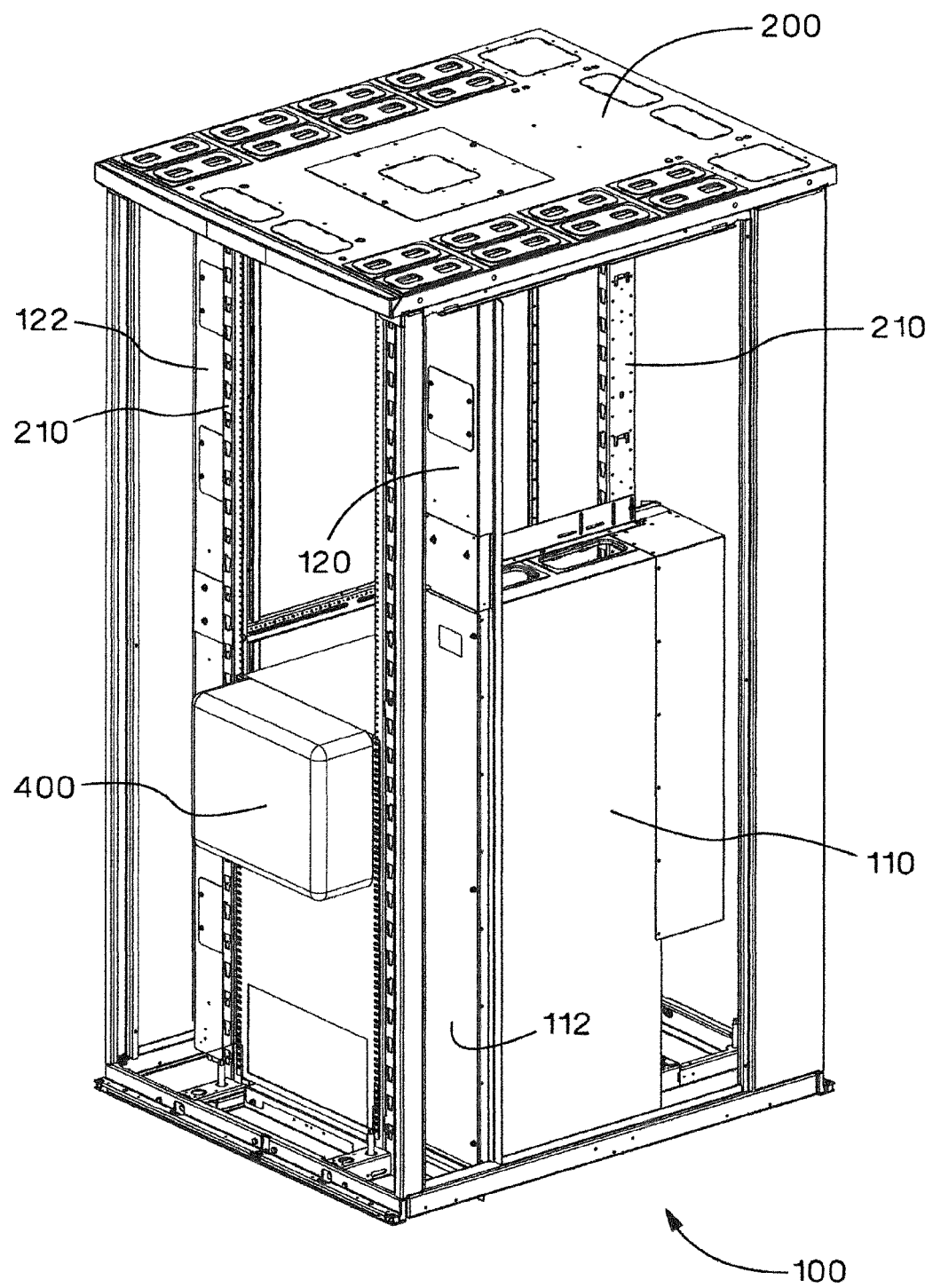
FIG. 4 is a front perspective view of the thermal management system of FIG. 1, showing the thermal management system configured for electronic equipment requiring a front-to-back airflow pattern for cooling.
Figure 5:
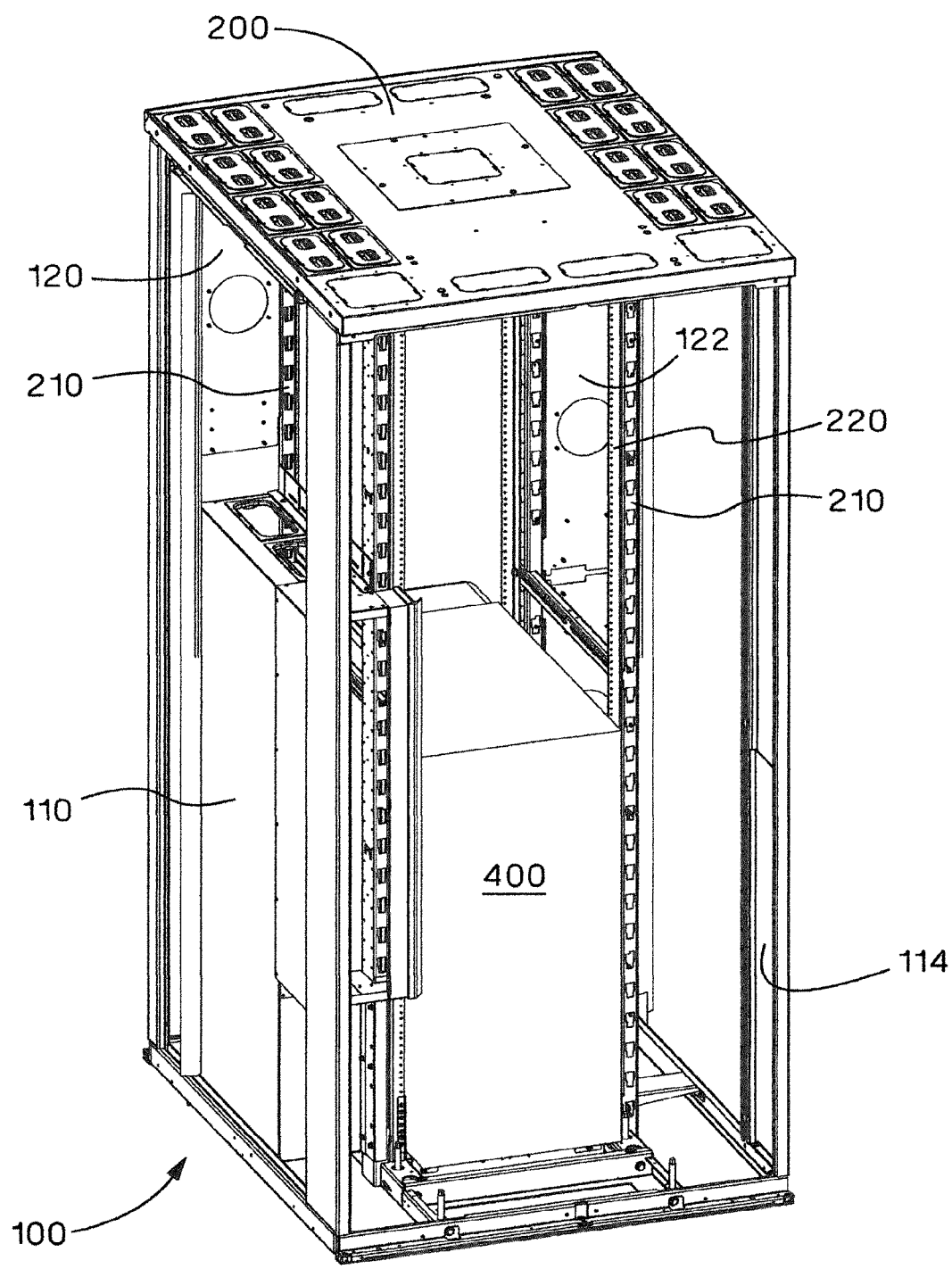
FIG. 5 is a back perspective view of the thermal management system of FIG. 4.
Figure 6:
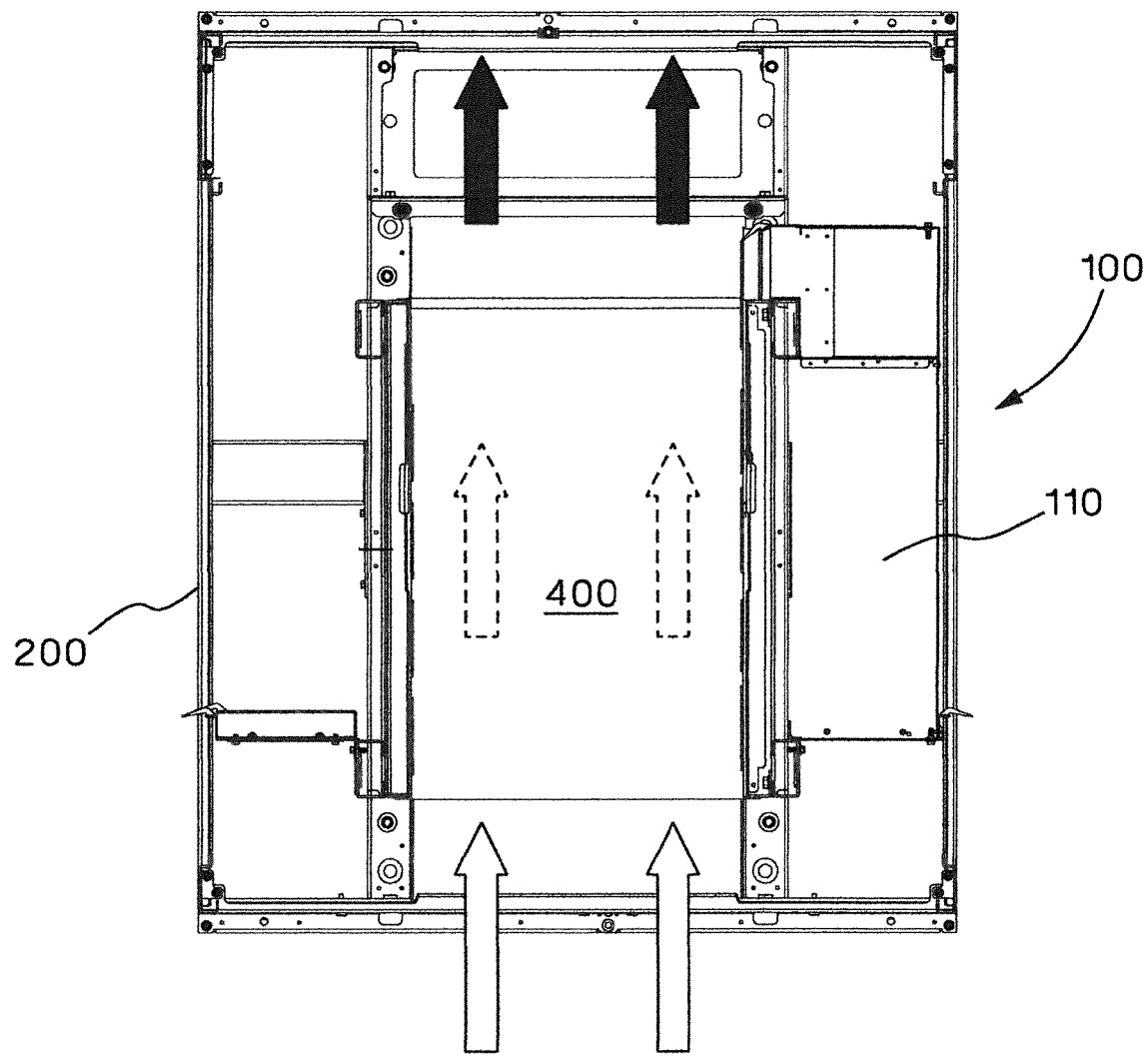
FIG. 6 is a top view of the thermal management system of FIG. 4, showing the front-to-back airflow pattern.

As shown in FIGS. 4-6, the thermal management system 100 is configured for electronic equipment 400 requiring a front-to-back airflow pattern for cooling (FIG. 6), such as Cisco's Nexus 7010 Switch. The front cover 112 of the intake duct 110 acts as a second partial height vertical blanking panel, similar to the first partial height vertical blanking panel 120, and together with the first partial height vertical blanking panel 120, the front cover 112 acts as a second full height vertical blanking panel, similar to the first full height vertical blanking panel 122, routing cold air from the front of the electronic equipment enclosure 200 to the front intake of the electronic equipment 400, as shown in FIG. 6. The back cover 114 of the intake duct 110 and the top covers 116 of the intake duct 110 have been removed to provide an area for routing cables through the electronic equipment enclosure 200. Preferably, the back cover 114 is stored along in the back side of the electronic equipment enclosure 200, as shown in FIG. 5. Additionally, the horizontal blanking panel 124 has been removed to accommodate the additional height of the electronic equipment 400.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A thermal management system for electronic equipment in an electronic equipment enclosure, the electronic equipment comprising at least one of a front intake and a side intake, a front portion of the electronic equipment enclosure in fluid communication with the front intake and a side portion of the electronic equipment enclosure in fluid communication with the side intake, the thermal management system comprising:
   an intake duct; and
   a front cover removably connected to the intake duct,
   wherein, when the front cover is connected to the intake duct, cold air is routed from the front portion of the electronic equipment enclosure to the front intake of the electronic equipment, and
   wherein, when the front cover is removed from the intake duct, cold air is routed from the front portion of the electronic equipment enclosure to the side intake of the electronic equipment.

2. The thermal management system of claim 1, wherein the intake duct comprises a top panel, a bottom panel, and a side panel.

3. The thermal management system of claim 2, wherein the top panel includes a top opening.

4. The thermal management system of claim 3, wherein the top opening includes a top cover.

5. The thermal management system of claim 3, wherein the top opening includes a grommet.

6. The thermal management system of claim 2, wherein the top panel, the bottom panel, and the side panel define a front opening.

7. The thermal management system of claim 6, wherein the front portion of the electronic equipment enclosure is in fluid communication with the front opening.

8. The thermal management system of claim 6, wherein, when the front cover is connected to the intake duct, the front cover closes off the front opening.

9. The thermal management system of claim 6, wherein, when the front cover is removed from the intake duct, the front cover is stored along a back side of the electronic equipment enclosure.

10. The thermal management system of claim 2, wherein the top panel, the bottom panel, and the side panel define a back opening.

11. The thermal management system of claim 10, further comprising a back cover removably connected to the intake duct, wherein, when the back cover is connected to the intake duct, the back cover closes off the back opening.

12. The thermal management system of claim 10, wherein, when the back cover is removed from the intake duct, the back cover is stored along a back side of the electronic equipment enclosure.

13. The thermal management system of claim 10, wherein, when the back cover is connected to the intake duct, the cold air is routed to the side intake of the electronic equipment.

14. The thermal management system of claim 10, wherein, when the back cover is removed from the intake duct, one or more cables are routed through the intake duct.

15. The thermal management system of claim 2, wherein the top panel, the bottom panel, and the side panel define a side opening in fluid communication with the side intake of the electronic equipment.

16. The thermal management system of claim 1, further comprising at least one blanking panel for separating a front portion of the electronic equipment enclosure and a back portion of the electronic equipment enclosure.

17. The thermal management system of claim 16, wherein the at least one blanking panel includes at least one vertical blanking panel.

18. The thermal management system of claim 17, wherein the at least one vertical blanking panel includes a first vertical blanking panel disposed along a first side of the electronic equipment enclosure.

19. The thermal management system of claim 18, wherein the at least one vertical blanking panel includes a second vertical blanking panel disposed along a second side of the electronic equipment enclosure opposite the first side of the electronic equipment enclosure.

20. The thermal management system of claim 16, wherein the at least one blanking panel includes at least one horizontal blanking panel.

* * * * *